(12) United States Patent
Kash et al.

(10) Patent No.: US 6,650,130 B1
(45) Date of Patent: Nov. 18, 2003

(54) INTEGRATED CIRCUIT DEVICE DEFECT DETECTION METHOD AND APPARATUS EMPLOYING LIGHT EMISSION IMAGING

(75) Inventors: Jeffrey A. Kash, Pleasantville, NY (US); Phillip J. Nigh, Williston, VT (US); David P. Vallet, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/386,572

(22) Filed: Aug. 31, 1999

(51) Int. Cl.[7] .................. G01R 31/303; G01R 31/28
(52) U.S. Cl. .................. 324/752; 324/501; 324/765
(58) Field of Search .................. 324/752, 501, 324/765; 250/338.1, 338.4; 382/149; 348/80, 126; 438/16, 17; 356/394

(56) References Cited

U.S. PATENT DOCUMENTS

| | | | |
|---|---|---|---|
| 3,350,702 A | 10/1967 | Herman | 340/228 |
| 4,680,635 A | 7/1987 | Khurana | 358/211 |
| 4,755,874 A | 7/1988 | Esrig et al. | 358/106 |
| 4,811,090 A | 3/1989 | Khurana | 358/93 |
| 5,006,717 A | 4/1991 | Tsutsu et al. | 250/484 |
| 5,130,644 A * | 7/1992 | Ott | 438/16 |
| 5,136,373 A | 8/1992 | Kamiya et al. | 358/93 |
| 5,493,236 A * | 2/1996 | Ishii et al. | 324/752 |
| 5,504,431 A | 4/1996 | Maeda et al. | 324/501 |
| 5,598,100 A | 1/1997 | Maeda et al. | 324/501 |
| 5,783,835 A | 7/1998 | Hollman et al. | 250/559.46 |

\* cited by examiner

Primary Examiner—Ernest Karlsen
(74) Attorney, Agent, or Firm—Downs Rachlin Martin PLLC

(57) ABSTRACT

A method of and apparatus (10) for detecting one or more defects (130) in a plurality of chips (110) on a wafer (40). The method comprises a first step of simultaneously providing electrical power to the plurality of chips, thereby generating one or more light signals (120) corresponding to the one or more defects in the plurality of chips. The second step is simultaneously forming an image (150) of the plurality of chips so as to simultaneously detect the one or more light signals. The apparatus (10) for carrying out the method comprises electrical probes (30) for providing electrical power to the plurality of chips, a detector (60) to detect the one or more light signals emitted by the chips as a result of electrical power interacting with the one or more defects, and an imaging system (50) arranged so as to form an image of the plurality of chips, including the light signals, onto the detection surface (64).

9 Claims, 7 Drawing Sheets

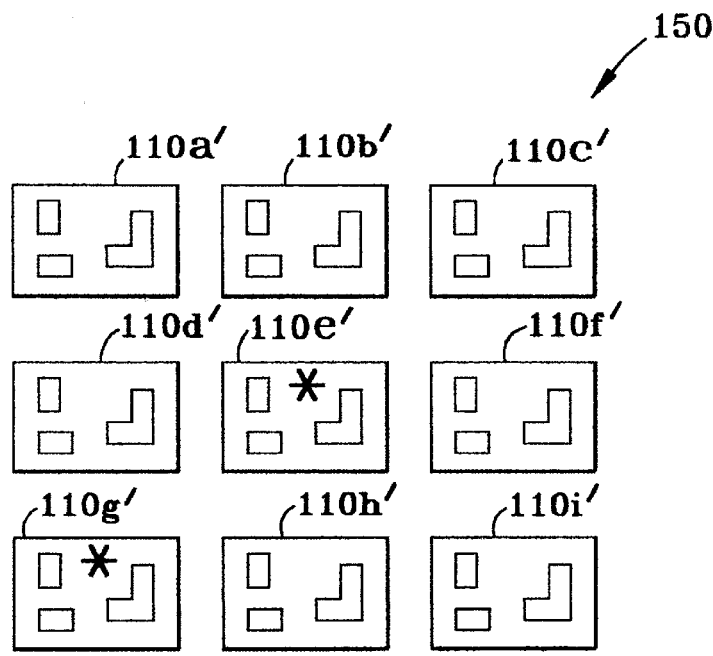
FIG. 5
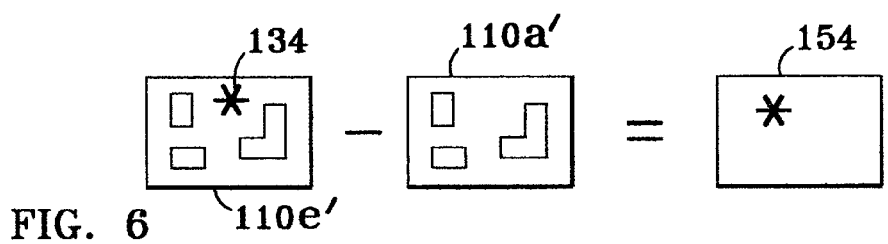
FIG. 6
FIG. 7a
FIG. 7b

INTEGRATED CIRCUIT DEVICE DEFECT DETECTION METHOD AND APPARATUS EMPLOYING LIGHT EMISSION IMAGING

FIELD OF THE INVENTION

The present invention pertains to apparatus and methods for inspecting integrated circuit devices, and in particular to such apparatus and methods for detecting defects in integrated circuit devices by imaging light emissions therefrom.

BACKGROUND OF THE INVENTION

Detecting defective integrated circuit devices ("chips") on a wafer early in the semiconductor manufacturing process saves significant time and money in subsequent processing and testing. Currently, defects are detected in a variety of ways, including burn -in, voltage screen and IDDq (i.e., quiescent current) testing. Performing these tests at wafer level requires individually probing each chip, applying input signals and measuring the corresponding output signals.

Further, in the case of IDDq testing, current readings are imperfect indicators of the presence of random defects, primarily for two reasons. The first reason is that current readings give no indication of whether any excess current is distributed throughout the chip or confined to one or more specific locations. While most defect types will cause an elevated current, an elevated current is not necessarily indicative of defects. Hence, with the present techniques for measuring current, there is the risk of scrapping otherwise good chips. The second reason is that current thresholds are imprecise. If set too low, good chips may be scrapped. If set too high, defective chips may remain undetected.

Numerous industry studies have shown that a very high percentage of defects in chips result in elevated quiescent power supply current. Further studies and failure analysis results indicate that this current generates photon emission and/or localized thermal emission (i.e., joule heating caused by IDDq-driven power dissipation) for a large majority of chip defects. Thus, an area of abnormal light emission or heat dissipation on a fully static CMOS part in a quiescent state, would confirm the presence of a manufacturing defect or design error.

Accordingly, techniques have been developed wherein light emitted from areas on a defective chip is imaged and analyzed to deduce the location of the defects. For example, U.S. Pat. No. 4,680,635, U.S. Pat. No. 4,755,874 and U.S. Pat. No. 5,783,835 each disclose an emission microscope for viewing the electro-luminescent emissions of a silicon (i.e., semiconductor) device.

SUMMARY OF THE INVENTION

However, each of these microscopes is only capable of imaging a single chip or a small region therein. More generally, the prior art fails to teach or suggest an apparatus or method of imaging a plurality of chips on a semiconductor wafer so that analysis of defects is performed over substantially the entire wafer simultaneously.

The present invention pertains to apparatus and methods for inspecting integrated circuits, and in particular to such apparatus and methods for detecting defects in integrated circuits by imaging light emissions therefrom.

A first aspect of the invention is a method of detecting one or more defects in a plurality of chips on a wafer. The method comprises the steps of first, simultaneously providing electrical power to the plurality of chips, thereby generating one or more light signals corresponding to one or more defects in the plurality of chips. The next step is simultaneously forming an image of the plurality of chips so as to simultaneously detect the one or more light signals.

A second aspect of the invention is the method as described above, wherein the image of the plurality of chips is formed on a detection surface, and the image is processed so as to identify which chips in the plurality of chips contain the one or more defects. The latter step is preferably accomplished by one of two methods of image processing, discussed in detail below.

A third aspect of the invention is an apparatus for identifying one or more defects in a plurality of chips on a wafer. The apparatus comprises a test head having electrical probes for providing electrical power to the plurality of chips, and a detector to detect one or more light signals emitted by the plurality of chips in response to the electrical power (e.g., current) interacting with a one or more chip defects. The apparatus further includes an imaging system arranged so as to form an image of the plurality of chips, including the light signals corresponding to the defects, onto the detector.

A fourth aspect of the invention is the apparatus as described above, and further including an image processing unit electrically connected to the detector, and an output device electrically connected to the image processing unit, for outputting information from the image processing unit pertaining to the chip defects.

BRIEF DESCRIPTION OF THE DRAWINGS

FIG. 5 shows an image of the plurality of chips shown in FIGS. 3a and 3b as formed by the imaging lens of the apparatus in FIG. 1;

FIG. 6 illustrates how the predetermined structure of a good chip image is subtracted from a defective chip image to form a difference image used to deduce the existence and location of a defect in the defective chip;

FIGS. 7a and 7b show matrices of the pixel values associated with the difference image for a good chip (FIG. 7a) and a defective chip (FIG. 7b);

DETAILED DESCRIPTION OF THE INVENTION

The present invention pertains to apparatus and methods for inspecting integrated circuits, and in particular to such apparatus and methods for detecting defects in integrated circuits by imaging light emissions therefrom.

Figure 1:
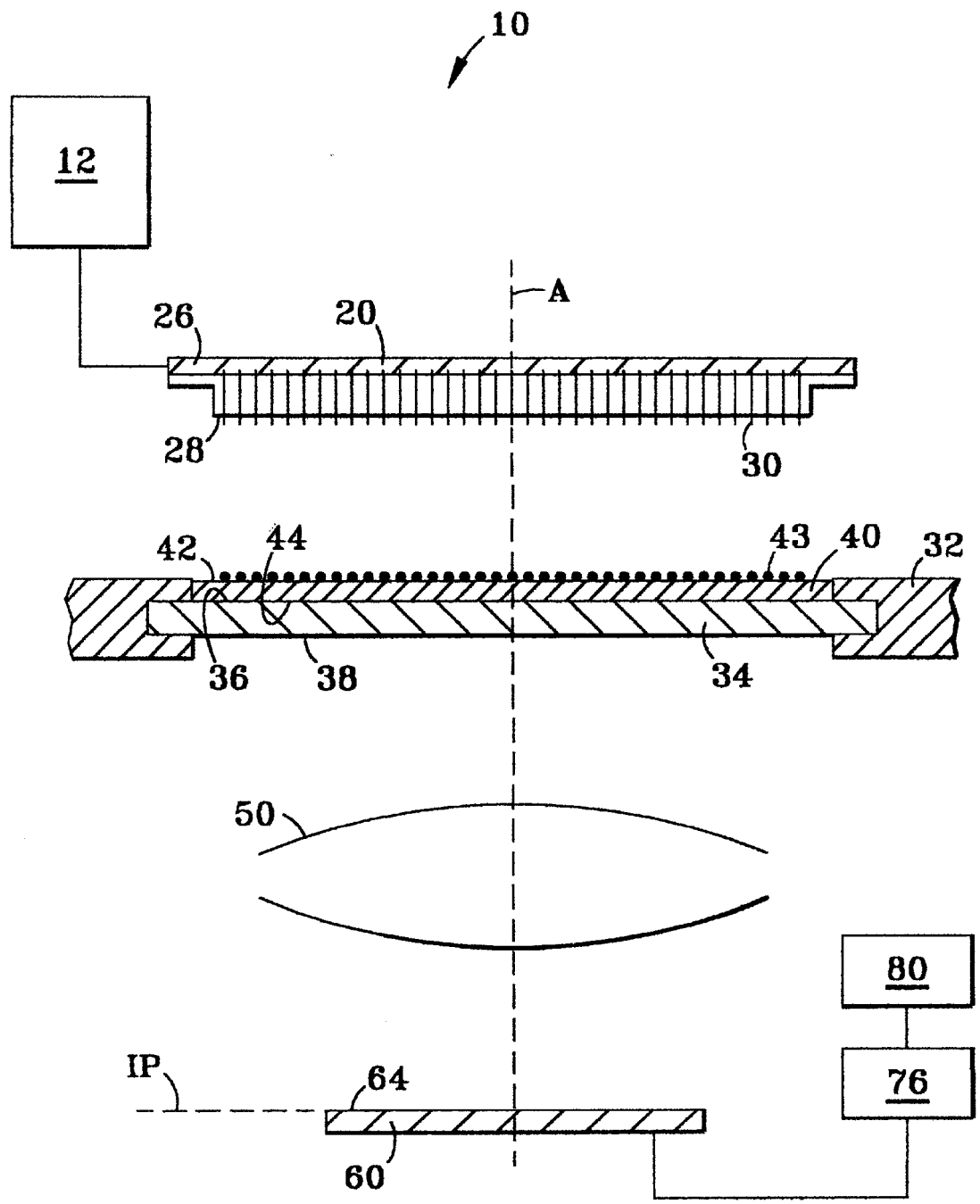
FIG. 1 is a schematic cross-sectional diagram of the defect detection apparatus of the present invention.

With reference to FIG. 1, defect imaging apparatus 10 comprises an electrical power supply 12 electrically connected to a test head 20. The latter has an upper surface 26 and a lower planar surface 28, and is arranged along an axis A passing substantially perpendicularly through the upper and lower surfaces. Test head 20 includes a planar array of electrical probes 30 depending from lower surface 28, and a power distribution grid (not shown) arranged on upper surface 26. Electrical probes 30 are electrically connected to the power distribution grid, which in turn is electrically connected to power supply 12.

Apparatus 10 further includes a product wafer support stage 32 arranged adjacent and substantially parallel to lower surface 28 of test head 20 along axis A. Support stage 32 includes a support member 34 with an upper surface 36 and a lower surface 38, designed to support a product wafer 40 and to transmit light emitted from the wafer, as discussed below. Wafer 40 has an upper surface 42 upon which is an array of electrical probe pads 43. The latter are electrically connected to a plurality of chips 110 (not shown in FIG. 1; see FIGS. 3a and 3b) formed within wafer 40. Probe pads 43 are arranged to contact electrical probes 30 of test head 20 when the test head and wafer are aligned with each other and then brought together along axis A. Wafer 40 also has a lower surface 44 which rests upon upper surface 36 of support member 34 when the wafer is placed in support stage 32.

Apparatus 10 further includes, in order along axis A from support stage 32, an imaging lens 50 having an image plane IP, and a detector 60 with a detection surface 64 arranged in the image plane. Detector 60 may include, for example, a CCD array having 1024×1024 pixels or 2048×2048 pixels, a mercury-cadmium-telluride (HgCdTe) imaging detector (e.g., a 256×256 Rockwell PICNIC array) or an imaging photomultiplier such as the Quantar MEPSICRON™. The particular detector chosen should have a sensitivity over an appropriate range of the infrared spectrum i.e., greater than about 0.75 microns. Other possible detectors include indium gallium arsenide (InGaAs) array detectors or intensified CCD detectors.

For a wafer 40 having a 200 mm diameter $d_W$ and detection surface 64 having a diagonal diameter $d_D$, imaging lens 50, wafer 40 and detection surface 64 need to be mutually arranged such that the imaging magnification magnitude between the wafer and the detection surface is approximately $d_D/d_W$. As an example, for a wafer diameter $d_W$=200 mm and a detection surface diameter of approximately $d_D$=25 mm, the required imaging magnification magnitude is about ⅛. Alternatively, diameter $d_D$ of detection surface 64 can be made sufficiently large (i.e., $d_D$=200 mm) by combining multiple detectors so as to allow the imaging magnification magnitude to be made close to or equal to 1.

Apparatus 10 also includes an image processing unit 76 electrically connected to detector 60, and an output device 80 electrically connected to the image processing unit.

Figure 2:
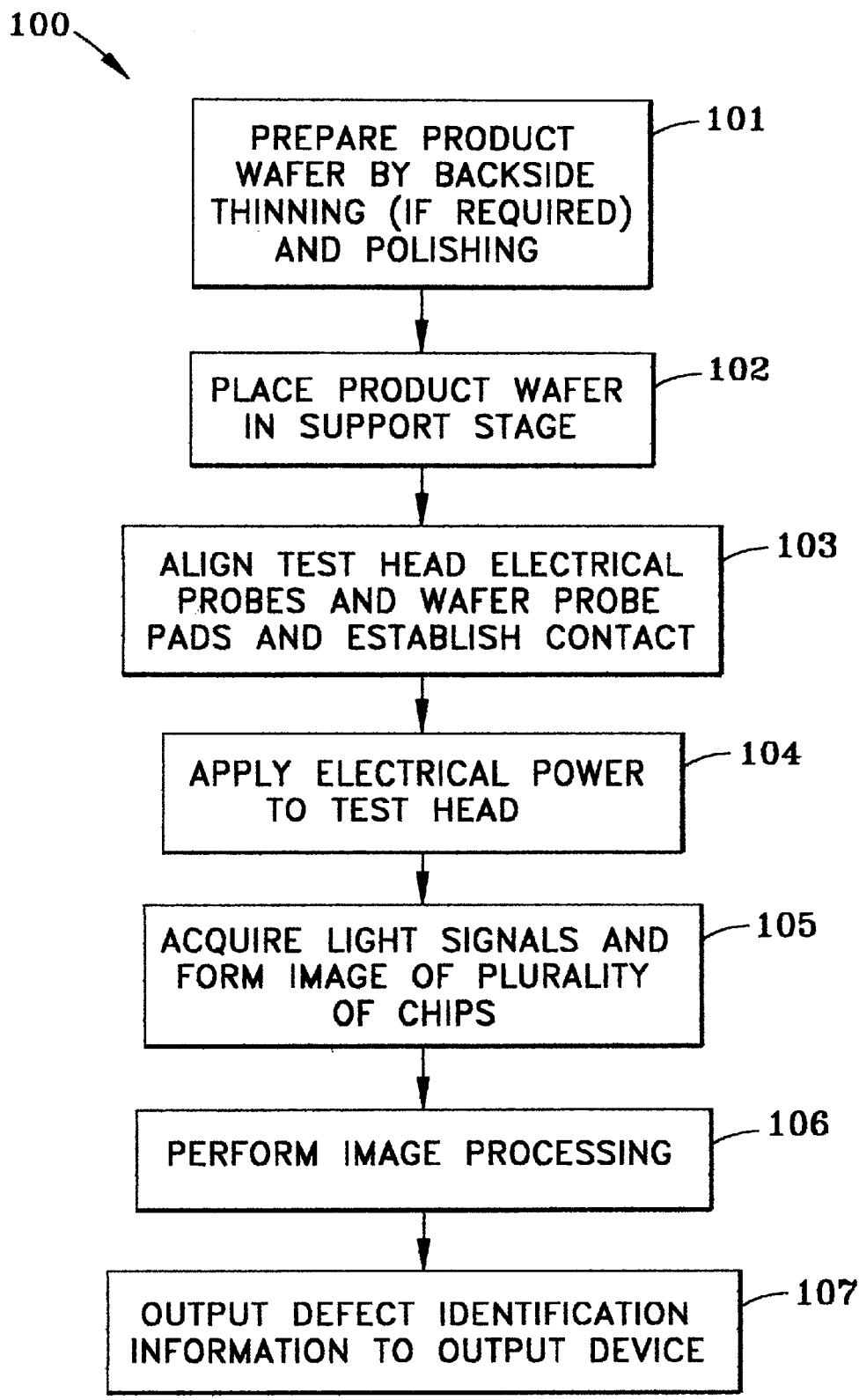
FIG. 2 is a flow chart of the steps of the general method of performing defect detection and screening using the apparatus of FIG. 1.

With reference now also to flow chart 100 of FIG. 2 and Steps 101–107 therein, the operation of and method of using apparatus 10 to identify defective chips on a wafer is as follows. In Step 101, wafer 40 is prepared by thinning lower surface 44 (if required) and polishing same. In Step 102, wafer 40 is placed in support stage 32 with lower surface 44 of the wafer resting upon upper surface 36 of support surface 34. In Step 103, the relative position of wafer 40 with respect to test head 20 is adjusted by moving support stage 32 and test head 20 such that electrical probes 30 of the test head and electrical probe pads 43 on the wafer are aligned. Wafer 40 and probe head 20 are then brought together along axis A such that contact is established between electrical probes 30 and probe pads 43.

Figure 3A:
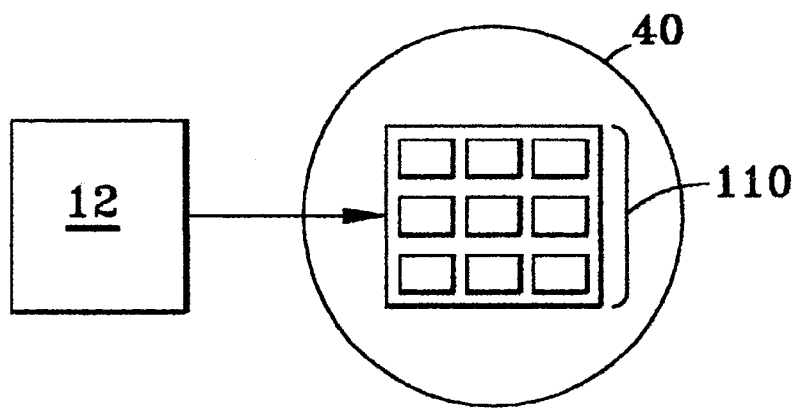
FIG. 3a is a plan view of a semiconductor wafer having a plurality of chips.
Figure 3B:
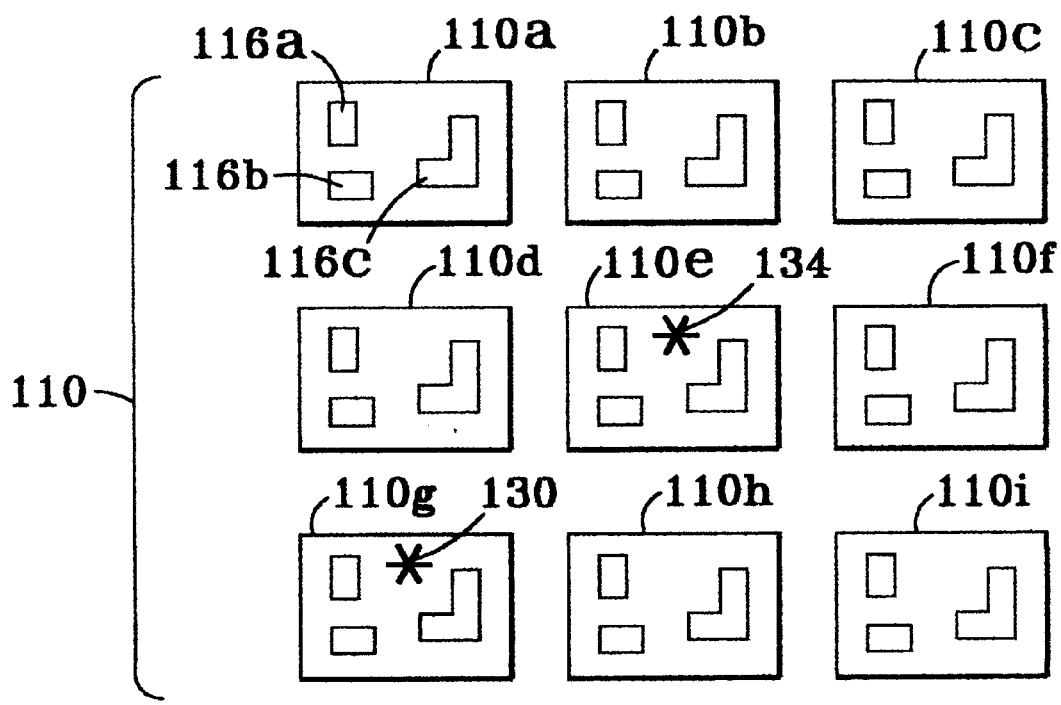
FIG. 3b is an exploded section of a portion of the semiconductor wafer of FIG. 3a, showing the predetermined chip structure and the presence of defect locations on certain of the chips.
Figure 4:
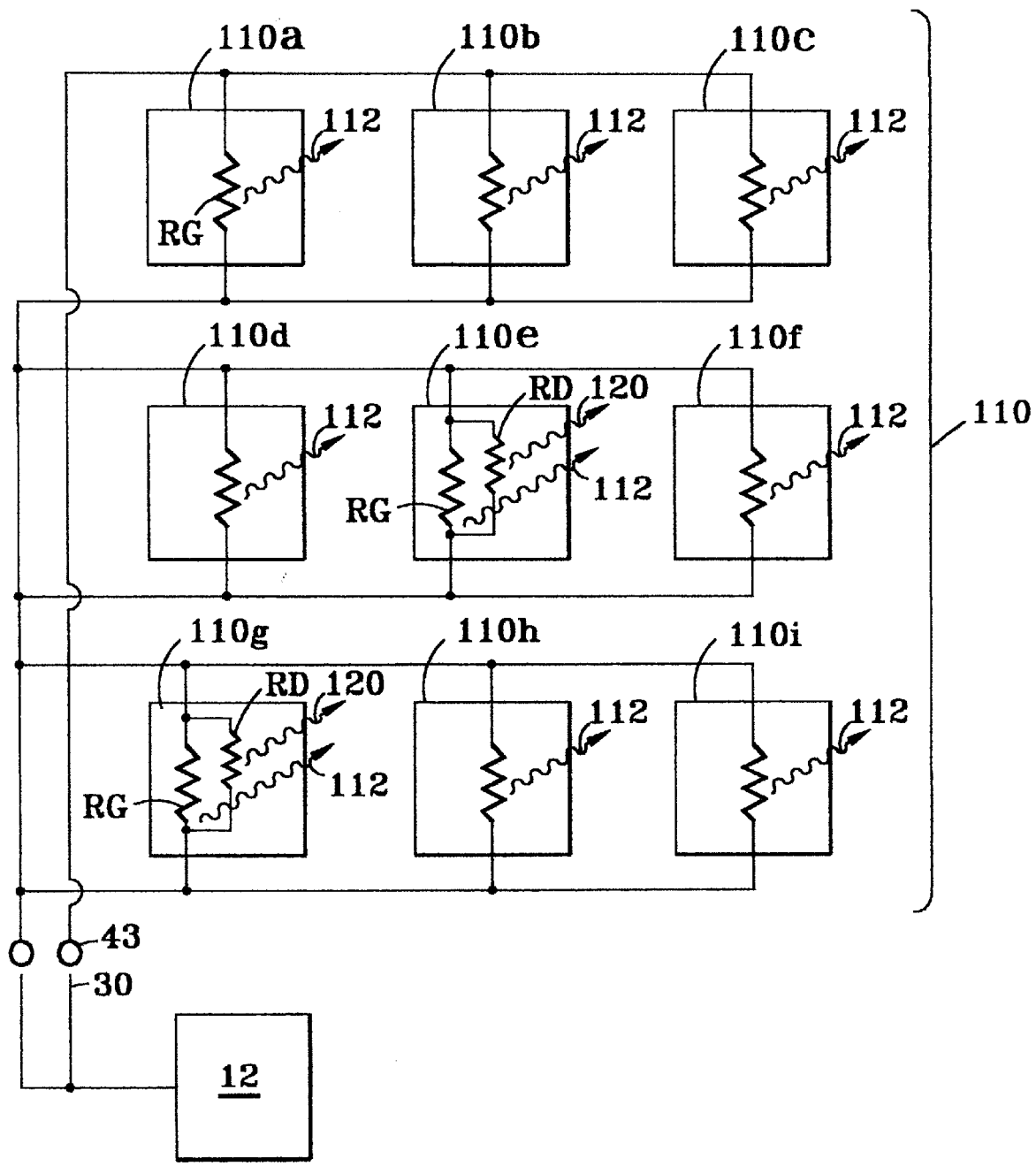
FIG. 4 is a schematic circuit diagram of the plurality of chips shown in FIGS. 3a and 3b, showing how light is emitted from good chips and defective chips.

In Step 104, electrical power from power supply 12 is applied to test head 20 through the power distribution grid down to electrical probes 30. With reference now also to FIGS. 3a, 3b and 4, the electrical power then flows through electrical probe pads 43 and into each of chips 110a–110i of a plurality of chips 110. At this point, the electrical power applied to chips 110 causes first light (hereinafter, "light signals") 112 (FIG. 4) to be emitted from each chip 110a–110i in predetermined locations 116a–116c (FIG. 3b). For chips 110e and 110g, additional (i.e., second) light signals 120 are emitted from non-predetermined locations 130 and 134 (FIG. 3b). As is known, light signals 120 are caused by the electrical power interacting with chip defects, such as a transistor gate oxide disruption or an improperly biased junction. Such defects are generally due to a process, design or manufacturing error.

The effect of the chip defects can be modeled, with reference to FIG. 4, as light signals being emitted from a predetermined resistor RG representing the inherent leakage path for a "good chip" (e.g., chip 110a) and additional resisters RD in parallel representing the leakage path associated with chip defects (e.g., chip 110e).

With reference again to FIGS. 1 and 2, and also to FIG. 5, in Step 105, light signals 112 and light signals 120 emitted from plurality of chips 110 pass through wafer 40 and out lower surface 44 due to the transparency of the silicon wafer material to infrared light. Light signals 112 and 120 are then collected by imaging lens 50. The latter then forms on detection surface 64 an image 150 of plurality of chips 110, based on light signals 112 and 120. In Step 106, image 150 is processed by image processing unit 76. In the present invention, there are two preferred methods of processing image 150 to identify defective chips, each of which is discussed below in greater detail. Once the image processing step is performed, then in Step 107, the defect identification information pertaining to the location of defective chips, and perhaps additionally the location of these defects, as deduced in Step 6, is output to output device 80.

The two preferred methods of image processing to identify defects in plurality of chips 110 are now set forth. With reference now to FIGS. 1 and 5, in the first preferred method, image 150 of plurality of chips 110 is simultaneously detected by detector 60 and stored electronically in image processing unit 76. Also stored electronically in image processing unit 76 is a defect-free (i.e., "good chips") image of plurality of chips 110. Image 150 and the "good chips" image are compared and the difference in the images (i.e., the difference image) is calculated and stored electronically in image processing unit 76. This procedure is illustrated in FIG. 6 for the image 110e' of chip 110e having a defect location 134. The good chip image, as represented by image 110a' of chip 110a, is subtracted from image 110e' of chip 110e, resulting in a difference image 154 showing a single defect location 134. In the present invention, this procedure is carried out simultaneously for plurality of chips 110.

With reference now to FIGS. 7a and 7b, the pixel values constituting the difference image are electronically stored as discrete intensity values arranged in a matrix corresponding to the pixel array of detection surface 64.

The defect location(s) is/are determined for a plurality of chips by identifying pixel values higher than 1 (i.e., the normalized background value) in the difference image. FIG. 7a is an 8×8 matrix 160 representing a difference image for a single good chip (e.g., chip 110a). In other words, matrix 160 represents a local difference matrix, while the difference matrix for plurality of chips 110 represents a global difference matrix. FIG. 7b is an 8×8 local difference matrix 164 representing a difference image for an example defective chip having three defects, as indicated by the non-unit integer pixel values at matrix locations (3,2), (6,6) and (7,3). For a detector having a CCD array of 1024×1024 pixels and a wafer 130 having about 200 chips, there are approximately 5000 pixels per chip, or an array of about 70×70 pixels per chip available for forming each local difference matrix. For a 256×256 pixel HgCdTe array detector and the same wafer 130, there are approximately 144 pixels per chip, or an array of about a 11×11 pixels per chip. Thus, the number of pixels in detector 60 determines the "fineness" (i.e., the array size) of both the local and global difference matrices for each chip.

Figure 8:
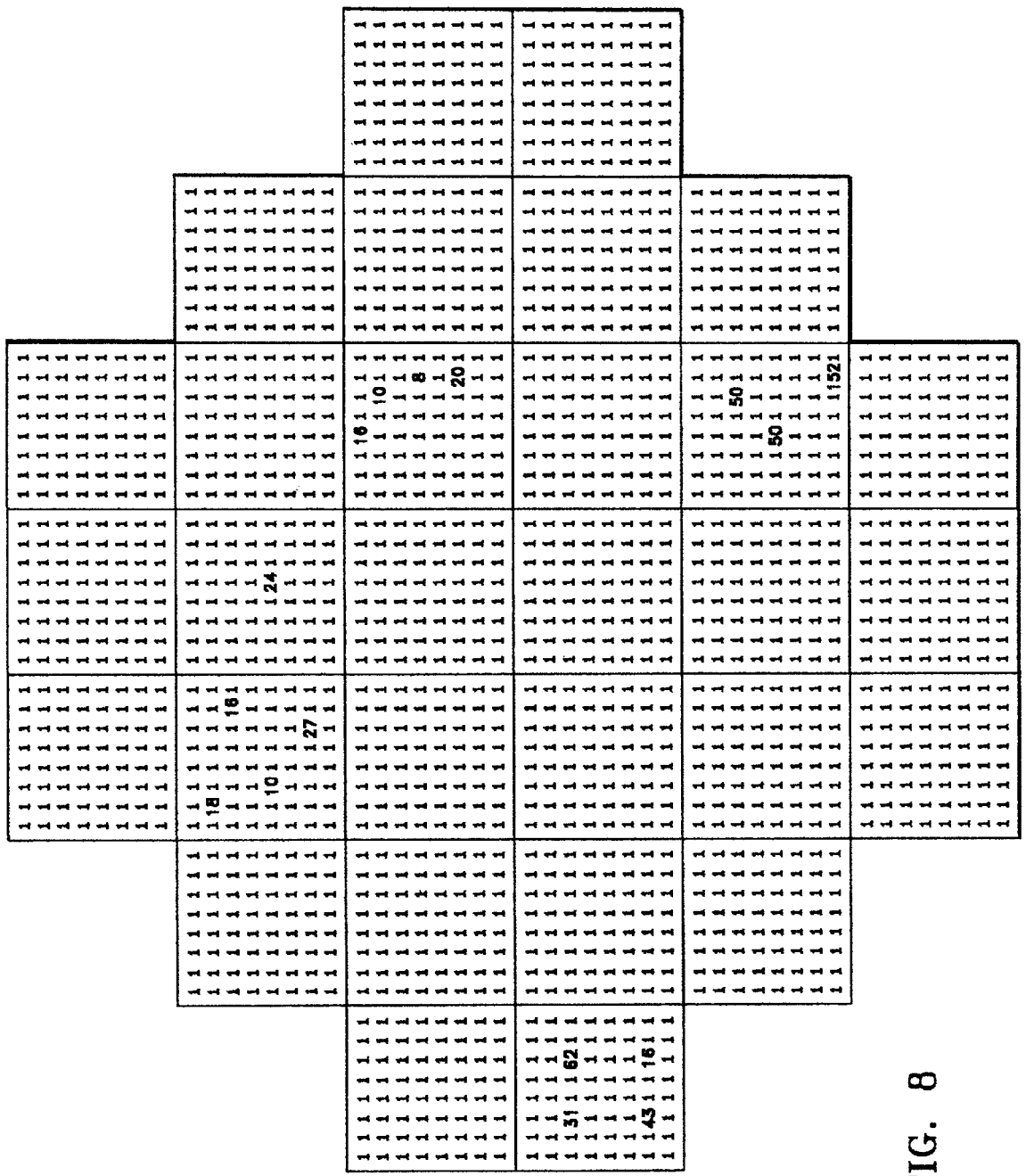
FIG. 8 is a representation of a global difference matrix comprising an array of local difference matrices for each chip on a semiconductor wafer, such as may be displayed on an output device.

With reference now also to FIG. 8, at this point, a global difference matrix 200 for plurality of chips 110 is output to output device 80, thereby providing defect identification information to an operator of apparatus 10.

Figure 9:
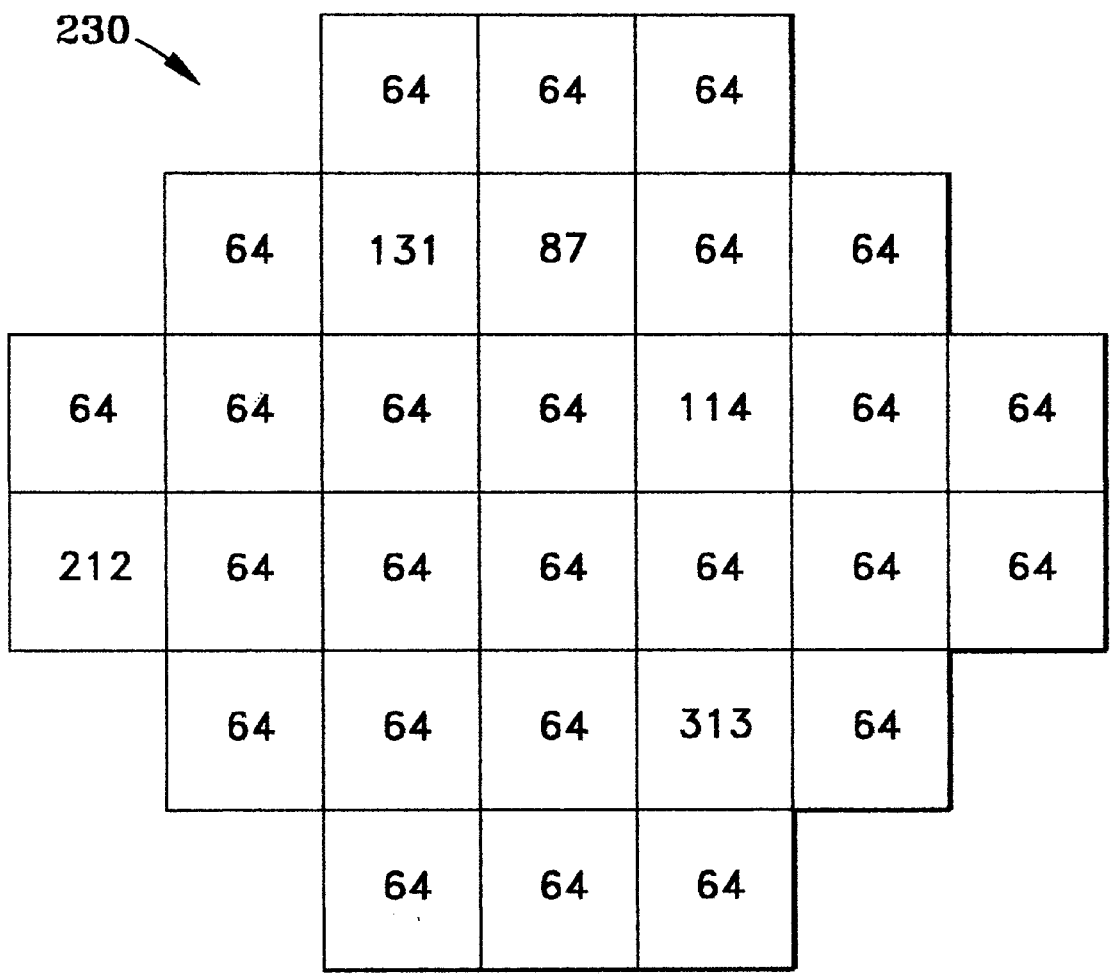
FIG. 9 is a representation of a global difference matrix similar to that shown in FIG. 8, except that the pixel values for each local difference matrix are summed, thereby creating a plurality of numerical values, with each value being associated with a chip on the wafer and representative of whether or not one or more defects are present in each chip.

With reference now to FIG. 9, the second method for identifying one or more chip defects is the same as the first method up to and including the step of electronically storing the difference image in image processor 76. However, in the second method, at this point the pixel values corresponding to each chip are summed (or "binned") to provide a single numerical value associated with each chip 110a–110i of plurality of chips 110, thereby forming a global difference image matrix 230. Each value in global difference matrix 230 provides a single measure of whether a particular chip is defective by being compared to a threshold value representative of a good (non-defective) chip. For example, with reference also again to FIGS. 7a and 7b, the sum of (normalized) pixel values for the 8×8 local difference matrix 160 representing a good chip is 64. For local difference matrix 164, representing a defective chip, the corresponding sum of pixel values is 87. By setting a threshold value for the summed pixel values for each chip (e.g., a threshold value of 64 or perhaps slightly higher to account for noise), defective chips on wafer 40 can be identified faster than in the first method, albeit without information about defect location within each chip.

The choice of analyzing a global difference matrix 200 of all available pixel values (the first method) versus analyzing a global difference matrix 230 of pixel values summed over each chip (the second method) depends on whether a typical chip defect produces defect-related second light signals 120 having an intensity substantially greater than the intensity of the first(i.e., predetermined) light signals 112 from a good chip, and whether information about defect location within a chip is desired. In the case where light signal 120 is relatively low in relation to the light signal 112,the multiple pixel measurements associated with the first method will reduce light signal 112 per pixel by approximately the number of pixels used to image the chip. By way of example, for a 50×50 pixels/chip CCD array, the reduction factor is about 2500, and for a 12×12 pixels/chip HgCdTe detector, the reduction factor is about 144. The reduction in the predetermined light signal allows for a corresponding increase in sensitivity for detecting light signal 120 associated with a chip defect.

While the present invention has been described in connection with preferred embodiments, it will be understood that it is not limited to those embodiments. On the contrary, it is intended to cover all alternatives, modification and equivalents as may be included within the spirit and scope of the invention as defined in the appended claims.

What is claimed is:

1. A method of detecting one or more defects in a plurality of chips on a wafer comprising the steps of:
    a) providing electrical power to the plurality of chips so as to cause the plurality of chips to generate one or more light signals corresponding to the one or more defects in the plurality of chips;
    b) simultaneously forming an image of the plurality of chips so as to detect said one or more light signals;
    c) processing said image to produce an output that includes only indicators formed from light signals related to defects; and
    d) reviewing said output so as to identify which chips in the plurality of chips contain the one or more defects and to determine where the one or more defects are located on said chips.

2. A method according to claim 1, wherein said light signal has an infrared wavelength.

3. A method according to claim 2, wherein said infrared wavelength is greater than about 0.75 microns.

4. A method according to claim 1, wherein said electrical power is a current.

5. A method according to claim 1, wherein said plurality of chips includes substantially all the chips on the wafer.

6. A method according to claim 1, wherein the plurality chips are located at or near a first surface of the wafer, and wherein said light signals pass from the wafer through a second wafer surface opposite said first surface.

7. A method according to claim 1, wherein in said step (b), said imaging step includes the step of forming an image of the plurality of chips onto a detection surface.

8. A method according to claim 1, wherein said step (c) further includes the steps of:
    a) forming a first global matrix of intensity values from said image of said plurality of chips;
    b) providing a second global matrix of intensity values corresponding to an ideal image of said plurality of chips; and
    c) subtracting said second global matrix from said first global matrix, thereby forming a global difference matrix.

9. A method according to claim 8, further including the steps of:
    a) dividing said global difference matrix into a plurality of local difference matrices each corresponding to a chip in the plurality of chips;
    b) summing values in each of said local difference matrices and forming a plurality of first summed values;
    c) comparing said plurality of first summed values to a threshold value representative of a non-defective chip.

* * * * *